United States Patent
Matsushita

(10) Patent No.: US 10,354,835 B2
(45) Date of Patent: Jul. 16, 2019

(54) ION IMPLANTER, ION BEAM IRRADIATED TARGET, AND ION IMPLANTATION METHOD

(71) Applicant: SUMITOMO HEAVY INDUSTRIES ION TECHNOLOGY CO., LTD., Tokyo (JP)

(72) Inventor: Hiroshi Matsushita, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 0 days.

(21) Appl. No.: 15/992,862

(22) Filed: May 30, 2018

(65) Prior Publication Data

US 2018/0350557 A1    Dec. 6, 2018

(30) Foreign Application Priority Data

May 31, 2017   (JP) ................. 2017-107476

(51) Int. Cl.
*H01J 37/304*  (2006.01)
*H01J 37/317*  (2006.01)
*H01J 37/08*   (2006.01)

(52) U.S. Cl.
CPC ........... *H01J 37/304* (2013.01); *H01J 37/08* (2013.01); *H01J 37/3171* (2013.01); *H01J 2237/0473* (2013.01); *H01J 2237/30472* (2013.01); *H01J 2237/31703* (2013.01)

(58) Field of Classification Search
CPC ...... H01J 37/304; H01J 37/08; H01J 37/3171; H01J 2237/0473; H01J 2237/30472; H01J 2237/31703
See application file for complete search history.

(56) References Cited

U.S. PATENT DOCUMENTS

| 6,462,347 B1 | 10/2002 | Oh |
| 6,608,315 B1 * | 8/2003 | Saadatmand ....... H01J 37/3171 250/492.21 |
| 7,351,987 B2 | 4/2008 | Kabasawa et al. |

FOREIGN PATENT DOCUMENTS

| JP | H09-134702 A | 5/1997 |
| JP | 2000-156172 A | 6/2000 |
| JP | 3896543 B2 | 3/2007 |
| JP | 2012-048941 A | 3/2012 |
| JP | 4901094 B2 | 3/2012 |
| JP | 2015-043272 A | 3/2015 |

* cited by examiner

*Primary Examiner* — Nicole M Ippolito
*Assistant Examiner* — Sean M Luck
(74) *Attorney, Agent, or Firm* — Michael Best & Friedrich LLP

(57) ABSTRACT

An ion implanter includes an ion source configured to generate an ion beam including an ion of a nonradioactive nuclide, a beamline configured to support an ion beam irradiated target, and a controller configured to calculate an estimated radiation dosage of a radioactive ray generated by a nuclear reaction between the ion of the nonradioactive nuclide incident into the ion beam irradiated target and the nonradioactive nuclide accumulated in the ion beam irradiated target as a result of ion beam irradiation performed previously.

14 Claims, 11 Drawing Sheets

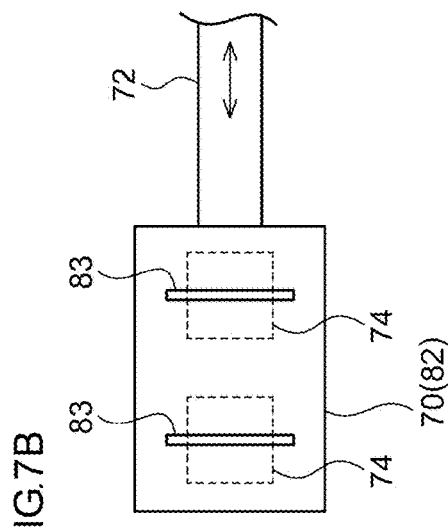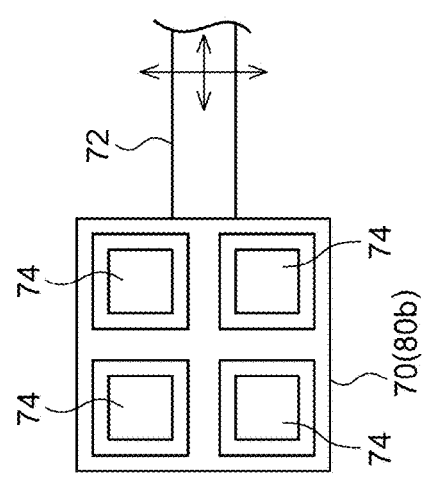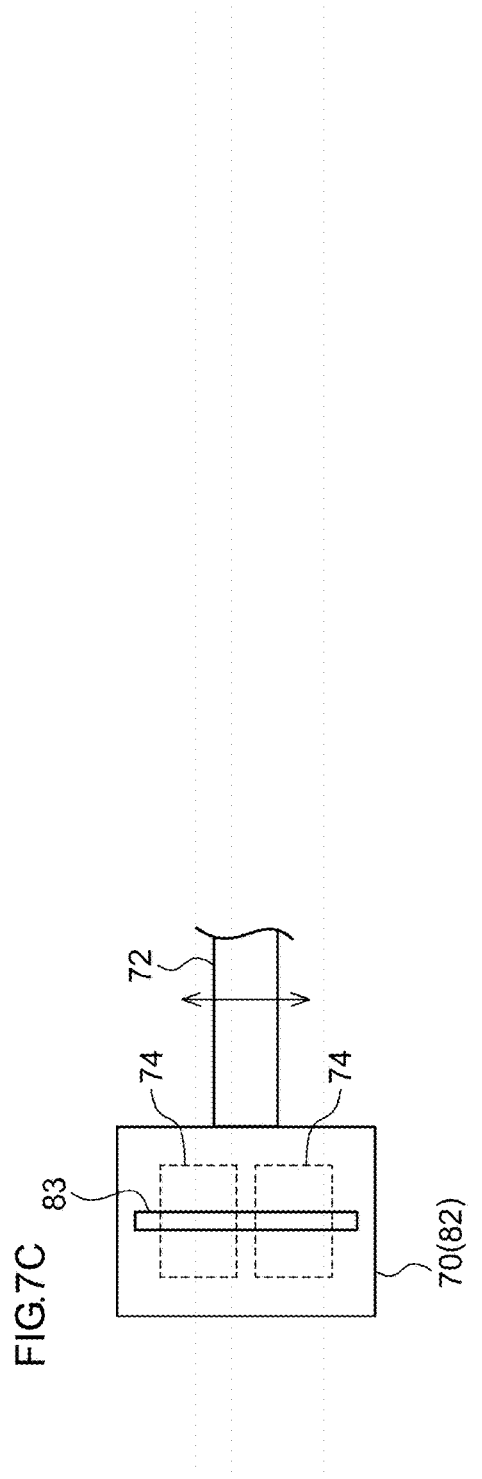

200
ION IMPLANTER, ION BEAM IRRADIATED TARGET, AND ION IMPLANTATION METHOD

RELATED APPLICATIONS

Priority is claimed to Japanese Patent Application No. 2017-107476, filed May 31, 2017, the entire content of which is incorporated herein by reference.

BACKGROUND

Technical Field

Certain embodiment of the present invention relates to an ion implanter, an ion beam irradiated target, and an ion implantation method.

Description of Related Art

In the related art, an ion converter is known, which includes a member which is installed on a traveling path of an ion beam and through which the ion beam can transmit and a polarity conversion material which is coated on a surface of the member such that a polarity of the ion in the ion beam is converted by collision between the polarity conversion material and the ion beam.

SUMMARY

According to an embodiment of the present invention, there is provided an ion implanter, including: an ion source configured to generate an ion beam including an ion of a nonradioactive nuclide; a beamline configured to support an ion beam irradiated target; and a controller configured to calculate an estimated radiation dosage of a radioactive ray generated by a nuclear reaction between the ion of the nonradioactive nuclide incident into the ion beam irradiated target and the nonradioactive nuclide accumulated in the ion beam irradiated target as a result of ion beam irradiation performed previously.

According to another embodiment of the present invention, there is provided an ion beam irradiated target which is provided in a beamline of an ion implanter, including: a plurality of irradiated regions which are positioned at locations different from each other, the plurality of irradiated regions include a high-energy-beam exclusive irradiated region which is allocated exclusively for a high energy ion beam accelerated to an energy exceeding a predetermined energy threshold value.

According to still another embodiment of the present invention, there is provided an ion implantation method, including: generating an ion beam including an ion of a nonradioactive nuclide; supporting an ion beam irradiated target; and calculating an estimated radiation dosage of a radioactive ray generated by a nuclear reaction between the ion of the nonradioactive nuclide incident into the ion beam irradiated target and the nonradioactive nuclide accumulated in the ion beam irradiated target as a result of ion beam irradiation performed previously.

BRIEF DESCRIPTION OF THE DRAWINGS

FIGS. 7A to 7C are schematic views each of which shows a switching structure of a plurality of irradiated regions provided in an ion beam irradiated target.

DETAILED DESCRIPTION

Figure 1:
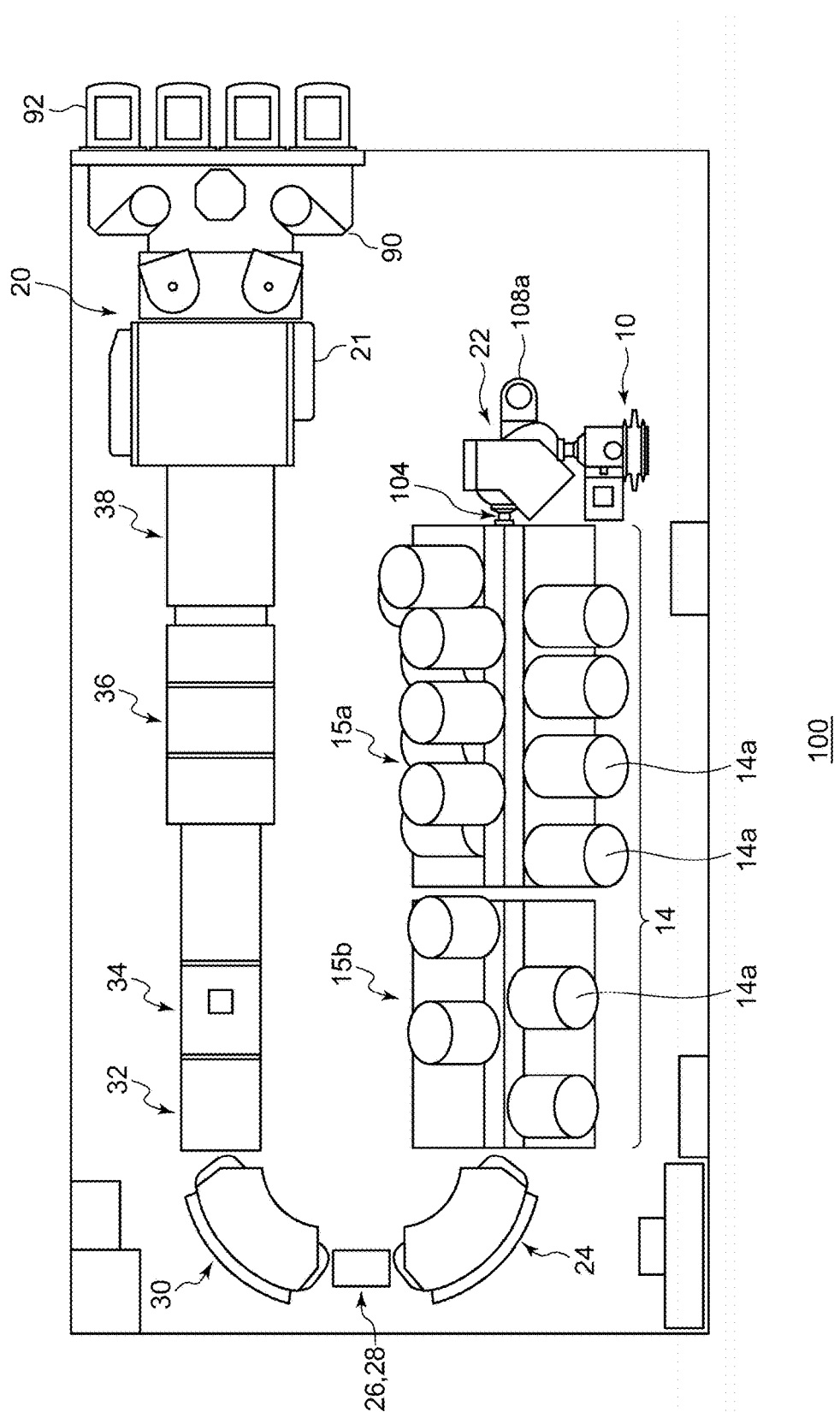
FIG. 1 is a top view schematically showing an ion implanter according to an embodiment of the present invention.

In a semiconductor manufacturing process, a process of implanting ions into a semiconductor wafer is generally performed in order to change conductivity of the semiconductor wafer, to change a crystal structure of the semiconductor wafer, or the like. In general, a device used in this process is referred to as an ion implanter. An ion implantation energy is determined according to a desired implantation depth of ions implanted into a wafer surface. A low energy ion beam is used for implantation into a shallow region and a high energy ion beam is used for implantation into a deep region.

In recent years, there is an increasing demand for so-called ultrahigh energy ion implantation using an ion beam having a higher energy compared to high energy ion implantation of the related art for implantation into a deeper region. An ion accelerated to an ultrahigh energy collides with a member which is provided in a beamline of the ion implanter, and thus, there is a possibility that a nuclear reaction is induced. According to the induced nuclear reaction, a radioactive ray such as neutron ray and a gamma ray may be generated. Radioactive substances may be generated in some cases.

It is desirable to cope with a nuclear reaction caused by a use of an ion beam having a relatively high energy.

Aspects of the present invention include any combination of the above-described constituent elements, or mutual substitution of constituent elements or expressions of the present invention among methods, apparatuses, systems, computer programs, data structures, recording media, or the like.

According to the present invention, it is possible to cope with a nuclear reaction caused by a use of an ion beam having a relatively high energy.

Hereinafter, an embodiment of the present invention will be described in detail with reference to the drawings. In descriptions and the drawings, the same reference numerals are assigned to the same or equivalent constituent elements, members, and process, and overlapping descriptions are appropriately omitted. The scales and shapes of the respective portions shown in the drawings are set for the sake of convenience in order to facilitate explanation and are not to be interpreted limitedly unless otherwise mentioned. The embodiment is an example and does not limit the scope of the present invention. All the features and combinations thereof described in the embodiments are not necessarily essential to the invention.

Figure 2:
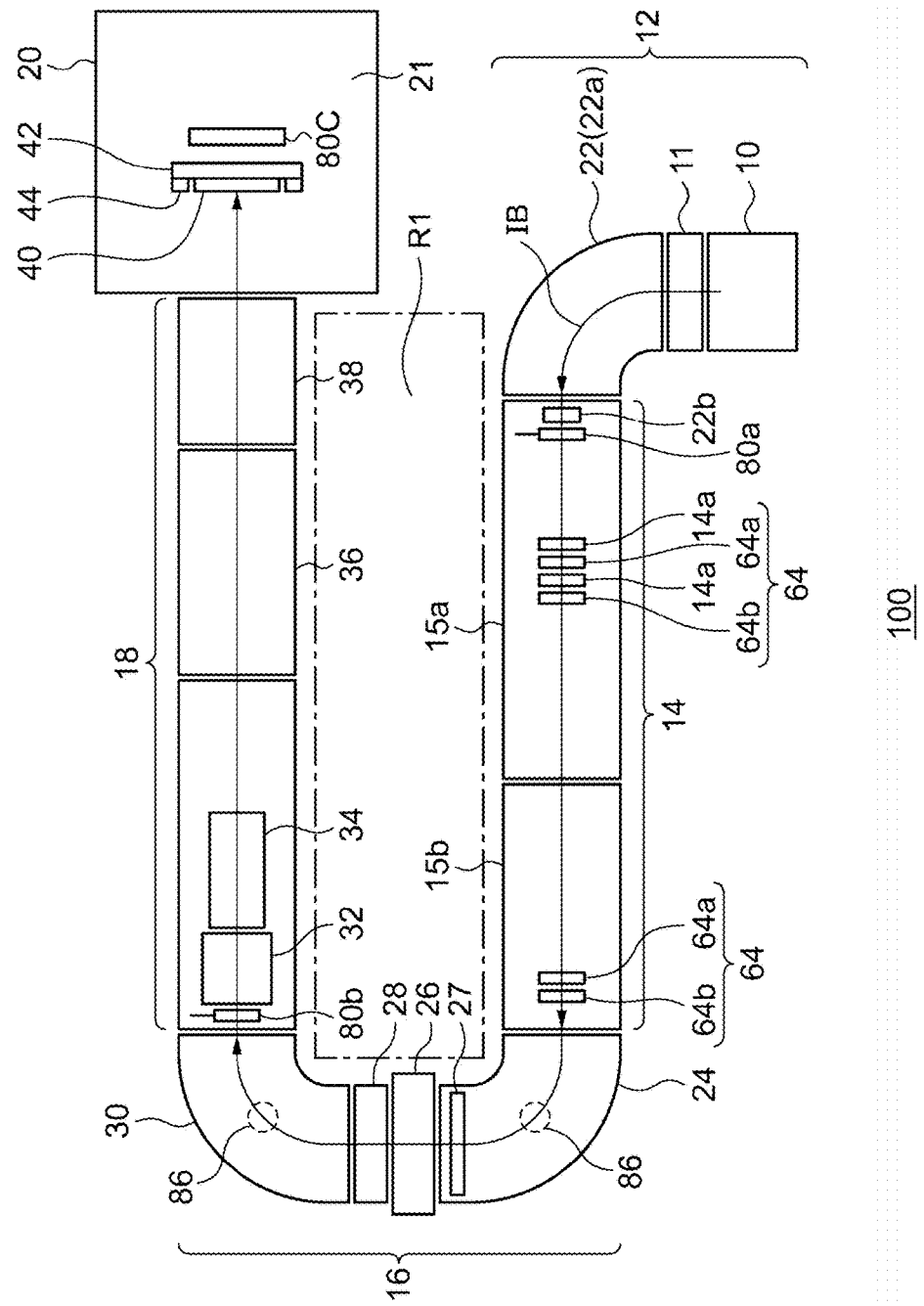
FIG. 2 is a view schematically showing a disposition of constituent elements of the ion implanter shown in FIG. 1.

FIG. 1 is a top view schematically showing an ion implanter 100 according to an embodiment of the present invention. FIG. 2 is a view schematically showing a disposition of constituent elements of the ion implanter 100 shown in FIG. 1. The ion implanter 100 is a so-called high energy ion implanter. The high energy ion implanter is an ion implanter which includes a radio frequency linear acceleration type ion acceleration unit and a high energy ion transport beamline. The high energy ion implanter accelerates an ion generated in an ion source 10 to a high energy, transports the ion to a workpiece (for example, a substrate or a wafer 40) along a beamline, and implants the ion to the workpiece.

As shown in FIG. 1 and/or FIG. 2, the ion implanter 100 includes an ion beam generating unit 12 which generates an ion and separates mass thereof, a high energy multistage linear acceleration unit 14 which accelerates the ion supplied from the ion beam generating unit 12 according to an acceleration parameter, a beam deflecting unit 16 which bends a trajectory of the ion beam IB in a U shape, a beam transport line unit 18 which transports the ion beam IB to a wafer 40, and a substrate supplying/processing unit 20 which uniformly implants the transported ion beam IB to the semiconductor wafer.

As shown in FIG. 2, the ion beam generating unit 12 includes an ion source 10, an extraction electrode 11, and a mass analyzer 22. In the ion beam generating unit 12, an ion beam is extracted from the ion source 10 and accelerated through the extraction electrode 11, and the extracted and accelerated ion beam is mass-analyzed by the mass analyzer 22. The mass analyzer 22 includes a mass analyzing magnet 22a and a mass resolving slit 22b. The mass resolving slit 22b is disposed in an entrance of the high energy multistage linear acceleration unit 14 which is a constituent element following the mass analyzer 22. The mass resolving slit 22b may be disposed immediately following the mass analyzing magnet 22a (that is, immediately in front of the high energy multistage linear acceleration unit 14).

A first beam measuring instrument 80a for measuring a total beam current of the ion beam is disposed at a forefront portion in the linear accelerator housing of the high energy multistage linear acceleration unit 14. The first beam measuring instrument 80a is configured so as to be inserted into or retracted from to the beam trajectory in an vertical direction by a drive mechanism. For example, the first beam measuring instrument 80a is a faraday cup. This faraday cup is referred to as an injector faraday cup. The injector faraday cup has a rectangular parallelepiped shape spreading in a horizontal direction and is configured such that an opening portion thereof faces an upstream side of the beamline. The first beam measuring instrument 80a is used to measure a total beam current of the ion beam IB when the ion source 10 and/or the mass analyzing magnet 22a is adjusted. The first beam measuring instrument 80a may be used to completely block the ion beam IB reaching a downstream side of the beamline on the beam trajectory as necessary.

As a result of the mass analysis by the mass analyzer 22, only the ion species necessary for implantation is selected, and the ion beam IB of the selected ion species is introduced to the following high energy multistage linear acceleration unit 14. The high energy multistage linear acceleration unit 14 includes a first linear acceleration unit 15a used for normal high energy ion implantation. The first linear acceleration unit 15a includes one or more (for example, a plurality of) radio frequency resonators 14a. The high energy multistage linear acceleration unit 14 may include a second linear acceleration unit 15b in addition to the first linear acceleration unit 15a. The second linear acceleration unit 15b is used along with the first linear acceleration unit 15a for ultrahigh energy ion implantation and other ion implantation. The second linear acceleration unit 15b includes one or more (for example, a plurality of) radio frequency resonators 14a. A direction of the ion beam IB accelerated by the high energy multistage linear acceleration unit 14 is changed by the beam deflecting unit 16.

The first linear acceleration unit 15a includes the plurality of radio frequency resonators 14a and a plurality of focusing/defocusing lenses 64. Each of the radio frequency resonator 14a includes a tubular electrode. For example, each of the focusing/defocusing lenses 64 is an electric field lens (for example, electrostatic quadrupole electrode (Q lens)). The focusing/defocusing lenses 64 may be a magnetic field lens (for example, quadrupole magnet). The tubular electrodes of the radio frequency resonators 14a and the focusing/defocusing lenses 64 (for example, Q lenses) are alternately arranged in a line, and the ion beam IB passes through the centers thereof. Similarly to the first linear acceleration unit 15a, the second linear acceleration unit 15b includes the plurality of radio frequency resonators 14a and the plurality of focusing/defocusing lenses 64.

The focusing/defocusing lenses 64 are provided to control convergence and divergence of the ion beam IB during the acceleration or after the acceleration and effectively transport the ion beam IB. The focusing/defocusing lenses 64 as many as necessary are disposed inside a radio frequency linear acceleration unit, and in the upstream side of and/or in the downstream side of the radio frequency linear acceleration unit. Horizontal focusing lenses 64a and vertical focusing lenses 64b are alternately arranged. That is, the horizontal focusing lens 64a is disposed in front of (or behind) the tubular electrode of the radio frequency resonator 14a, the vertical focusing lens 64b is disposed behind (or in front of) the tubular electrode of the radio frequency resonator 14a. An additional vertical focusing lens 64b is disposed behind the horizontal focusing lens 64a at the final end of the second linear acceleration unit 15b. The convergence and the divergence of the ion beam IB passing through the high energy multistage linear acceleration unit 14 are adjusted, and thus, the ion beam IB having an optimal two-dimensional beam profile is incident into the beam deflecting unit 16 positioned at a stage subsequent to the high energy multistage linear acceleration unit 14.

In the radio frequency linear acceleration unit, an amplitude V [kV] and a frequency f [Hz] of a voltage applied to the tubular electrode of each radio frequency resonator 14a are considered as acceleration parameters of the radio frequency (RF). In a case where radio frequency accelerations are performed in a plurality of stages, a phase φ [deg] between the radio frequency resonators 14a is added as the acceleration parameter. The amplitude V, the frequency f, and the phase p are parameters of the radio frequency (RF). A fixed value may be used for the frequency f. Operating parameters (referred to as focusing/defocusing parameters) of the focusing/defocusing lenses 64 are also considered. For example, the focusing/defocusing parameter is a Q lens voltage.

The high energy ion beam IB exiting from the high energy multistage linear acceleration unit 14 has a range of energy distribution. Therefore, in order to irradiate the wafer 40 with the high energy ion beam IB subjected to scanning and parallelization, at desired implantation accuracy, it is desirable to perform highly accurate energy analysis, a beam trajectory correction, and a beam convergence/divergence adjustment in advance.

The beam deflecting unit 16 performs the energy analysis, the beam trajectory correction, and the control of the energy dispersion of the high energy ion beam. The beam deflecting unit 16 includes at least two high accuracy deflecting electromagnets, at least one of an energy width limiting slit and an energy resolving slit, and at least one lateral focusing device. The plurality of deflecting electromagnets are configured to perform the energy analysis of the high energy ion beam, an accurate correction of an ion implantation angle, and a suppression of the energy dispersion.

The beam deflecting unit 16 includes an Energy Filter Magnet 24, an energy width limiting slit 27, a horizontal focusing quadrupole lens 26, an energy resolving slit 28, and a steering magnet 30 in this order from the upstream side. The Energy Filter Magnet 24 is disposed on the downstream side of the high energy multistage linear acceleration unit 14. The horizontal focusing quadrupole lens 26 controls the energy dispersion. The steering magnet 30 provides beam steering (trajectory correction). The direction of the ion beam IB is changed by the beam deflecting unit 16 and thus, the ion beam IB is directed in a direction to the wafer 40.

A second beam measuring instrument 80b which measures the beam current is provided on the downstream side of the steering magnet 30. The second beam measuring instrument 80b is disposed in the forefront portion in a scanner housing, that is, immediately in front of abeam shaper 32. The second beam measuring instrument 80b is configured so as to be inserted into or retracted from the beam trajectory in the vertical direction by a drive mechanism. For example, the second beam measuring instrument 80b is a faraday cup. This faraday cup is referred to as a resolver faraday cup. The resolver faraday cup has a rectangular parallelepiped shape spreading in the horizontal direction and is configured such that an opening portion thereof faces the upstream side of the beamline. The second beam measuring instrument 80b is used to measure the total beam current of the ion beam IB when the high energy multistage linear acceleration unit 14 and/or the beam deflecting unit 16 is adjusted. The second beam measuring instrument 80b may be used to completely block the ion beam IB reaching the downstream side of the beamline on the beam trajectory as necessary.

The Energy Filter Magnet 24 is the most upstream-side magnet among the plurality of deflecting electromagnets of the beam deflecting unit 16. The steering magnet 30 is the most downstream-side magnet among the plurality of deflecting electromagnets of the beam deflecting unit 16.

A centrifugal force and a Lorentz force are applied to the ion passing through the deflecting electromagnet of the beam deflecting unit 16 and are balanced to each other to draw an arc-shaped trajectory. This balance is represented by Expression mv=qBr. m is mass of the ion, v is velocity of the ion, q is an electric charge of the ion, B is a magnetic flux density of the deflecting electromagnet, and r is a curvature radius of the trajectory. Only the ion whose curvature radius r of the trajectory coincides with a curvature radius of a magnetic pole center of the deflecting electromagnet can pass through the deflecting electromagnet. In other words, in a case where the electric charge of the ions are the same as each other, only the ion having a specific momentum my can pass through the deflecting electromagnet to which a constant magnetic field B is applied. In actual, the Energy Filter Magnet 24 is a device which analyzes the momentum of the ion. Similarly, the steering magnet 30 or the mass analyzing magnet 22a is a momentum filter.

The beam deflecting unit 16 can deflect ion beam IB by 180° by using a plurality of magnets. Accordingly, it is possible to realize a high energy ion implanter, in which the beamline is formed in a U shape, by a simple configuration. The Energy Filter Magnet 24 and the steering magnet 30 are each configured to have a deflection angle of 90° such that the total deflection angle becomes 180°. A deflection amount performed by one magnet is not limited to 90°, and the following combinations may be used.

(1) one magnet having the deflection amount of 90° and two magnets each having the deflection amount of 45°

(2) three magnets each having the deflection amount of 60°

(3) four magnets each having the deflection amount of 45°

(4) six magnets each having the deflection amount of 30°

(5) one magnet having the deflection amount of 60° and one magnet having the deflection amount of 120°

(6) one magnet having the deflection amount of 30° and one magnet having the deflection amount of 150°

High accuracy of the magnetic field is required for the Energy Filter Magnet 24, and thus, a magnetic field measurement unit 86 having high accuracy for a precise magnetic field measurement is attached. The magnetic field measurement unit 86 is an appropriate combination of an NMR (nuclear magnetic resonance) probe (also referred to as MRP (magnetic resonance probe)) and an Hall probe, the MRP is used to calibrate the Hall probe, and the Hall probe is used to constantly feedback-control the magnetic field. The Energy Filter Magnet 24 is manufactured with strict accuracy so that the nonuniformity of the magnetic field is less than 0.01%. Similarly, the magnetic field measurement unit 86 is provided in the steering magnet 30. Only the Hall probe may be attached to the magnetic field measurement unit 86 of the steering magnet 30. A power supply whose current setting accuracy and current stability is within $1 \times 10^{-4}$ and a control unit of the power supply are connected to each of the Energy Filter Magnet 24 and the steering magnet 30.

The beam transport line unit 18 transports the ion beam IB emitted from the beam deflecting unit 16, and includes the beam shaper 32 including a focusing/defocusing lens group, a beam scanner 34, a beam parallelizer 36, and an electrostatic final energy filter 38. The final energy filter 38 includes a final energy separation slit. A length of the beam transport line unit 18 is designed according to a total length of the ion beam generating unit 12 and the high energy multistage linear acceleration unit 14. The beam transport line unit 18 is connected to the high energy multistage linear acceleration unit 14 via the beam deflecting unit 16 to form a U-shaped layout as a whole.

The substrate supplying/processing unit 20 is provided at the termination on the downstream side of the beam transport line unit 18. The substrate supplying/processing unit 20 includes a vacuum processing chamber 21 for irradiating the wafer 40 with the ion beam IB in the implantation processing. A beam monitor which measure a beam current, a beam position, an implant angle, a convergent/divergent angle, an ion distribution in the vertical and the horizontal directions of the ion beam IB, a charge neutralizing device which prevents the wafer 40 from being charged by the ion beam IB, a wafer transfer mechanism which loads and unloads the wafers 40 so as to set the wafer 40 at an appropriate position and angle, an ESC (Electrostatic Chuck) which holds the wafer 40 during ion implantation, and a wafer scanning mechanism which moves a wafer 40 in a direction perpendicular to the beam scan direction at a speed according to the beam current measured during implantation are accommodated in the vacuum processing chamber 21.

In the substrate supplying/processing unit 20, a third beam measuring instrument 80c is provided behind the ion implantation position. For example, the third beam measuring instrument 80c is a fixed type of horizontally spreading faraday cup which measures the total beam current of the ion beam IB. This horizontally spreading faraday cup is also referred to as a tuning faraday cup. The third beam measuring instrument 80c has a beam current measuring function capable of measuring the beam current over the entire scanning range of the ion beam IB in a wafer region. The third beam measuring instrument 80c is configured to measure the final set-up beam on the most downstream side of the beam trajectory.

In the substrate supplying/processing unit 20, as shown in FIG. 1, a wafer transfer device 90 is provided adjacent to the vacuum processing chamber 21. The wafer transfer device 90 includes an intermediate transfer chamber, a load lock chamber, and an atmospheric transfer section. The wafer transfer device 90 is configured to transfer a workpiece such as the wafer stored in a cassette station 92 into the vacuum processing chamber 21. The wafer is loaded from the cassette station 92 into the vacuum processing chamber 21 via the atmospheric transfer section, the load lock chamber, and the intermediate transfer chamber. Meanwhile, the wafer subjected to the ion implantation processing is carried out to the cassette station 92 via the intermediate transfer chamber, the load lock chamber, and the atmospheric transfer section.

In this manner, a beamline portion of the ion implanter 100 is configured as a horizontal U-shaped folded beamline having two opposed long straight portions. The upstream long straight portion includes the plurality of units which accelerate the ion beam IB extracted from the ion source 10. The downstream long straight portion includes the plurality of units which adjust the ion beam IB whose direction is turned from that in the upstream long straight portion and implant the ion beam IB into the wafer 40. The two long straight portions are configured to have substantially the same length. A work space R1 having a sufficient size for a maintenance work is provided between the two long straight portions.

In the high energy ion implanter having units disposed in a U shape, good workability is secured while a foot print thereof is suppressed. In the high energy ion implanter, the units and devices are configured as modules, and thus, the units and devices can be installed and uninstalled according to a beamline reference position.

The high energy multistage linear acceleration unit 14 and the beam transport line unit 18 are disposed in a folded manner, and thus, the total length of the high energy ion implanter can be suppressed. In the related art, the high energy multistage linear acceleration unit 14 and the beam transport line unit 18 are disposed approximately straightly. The curvature radius of each of the plurality of deflecting electromagnets configuring the beam deflecting unit 16 is optimized to minimize the device width. Accordingly, the foot print of the device is minimized, and in the work space R1 interposed between the high energy multistage linear acceleration unit 14 and the beam transport line unit 18, it is possible to work for each device of the high energy multistage linear acceleration unit 14 and the beam transport line unit 18. The ion source 10 having a relatively short maintenance interval and the substrate supplying/processing unit 20 requiring the loading/unloading of the substrate are disposed adjacent to each other, and a movement of an operator can be reduced.

Meanwhile, the ion implanter 100 may be configured to enable ultrahigh energy ion implantation. Here, for example, the ultrahigh energy means an energy larger than or equal to 4 MeV or larger than or equal to 5 MeV. According to the ultrahigh energy ion implantation, desired dopant ions are implanted into the wafer surface at a higher energy than typical high energy ion implantation of the related art, and thus, the desired dopants can be implanted into a deeper region (for example, a depth 5 μm or more) of the wafer surface. For example, the ultrahigh energy ion implantation is used to form a P-type region and/or an N-type region, in the manufacture of a semiconductor device such as an advanced image sensor.

The ion source 10 is configured to generate the ion beam IB containing an ion of a nonradioactive nuclide. For example, the nonradioactive nuclide is $^1$H, $^4$He, $^7$Li, $^9$Be, $^{11}$B, $^{12}$C or $^{14}$N.

The high energy multistage linear acceleration unit 14 can accelerate the ion beam IB generated by the ion source 10 to ultrahigh energy higher than or equal to 5 MeV. The ion implanter 100 may have an additional linear acceleration mechanism capable of accelerating the ion beam IB to the ultrahigh energy. However, the acceleration unit of the ion implanter 100 is not limited to the linear acceleration mechanism. The ion implanter 100 may be equipped with a different type acceleration unit capable of accelerating the ion beam IB to the ultrahigh energy, for example, a tandem acceleration mechanism. The present invention is not limited to a specific ion acceleration system.

The ion implanter 100 includes the beamline configured to support an ion beam irradiated target. The beamline is connected to the downstream side of the high energy multistage linear acceleration unit 14 or the different type acceleration unit and can transport the ion beam IB accelerated to the ultrahigh energy by the acceleration unit. The ion beam irradiated target is disposed at the location where the irradiation is performed with the ion beam IB having the ultrahigh energy in the beamline.

The beamline includes a plurality of beamline constituent elements. For example, the beamline includes the Energy Filter Magnet 24, the horizontal focusing quadrupole lens 26, the energy width limiting slit 27, the energy resolving slit 28, the steering magnet 30, the beam shaper 32, the beam scanner 34, the beam parallelizer 36, the final energy filter 38, and the vacuum processing chamber 21, as the beamline constituent elements. The beamline includes beam current measuring instruments such as the second beam measuring instrument 80b or the third beam measuring instrument 80c, as the beamline constituent elements.

The ion beam irradiated target may be at least a part of the beamline constituent elements. For example, the ion beam irradiated target may be configured as at least a part of the beam deflection unit, an aperture plate, the beam shutter, the beam damper, the wafer support portion, or the wafer. The ion beam irradiated target may be configured as at least a part of the beam current measuring instrument provided for the beamline.

An irradiated region which is irradiated with the ion beam IB in the ion beam irradiated target may be the inner wall of the region to which the beam deflection magnetic field for deflecting the beam is applied in the Energy Filter Magnet 24 or the steering magnet 30. The irradiated region may be the aperture plate for separating the necessary components of the beam and may be an area including an aperture in the energy width limiting slit 27 or the energy resolving slit 28, for example. The irradiated region may be the beam shutter or the beam damper for blocking the beam. As mentioned above, the beam current measuring instrument may be used as the beam shutter or the beam damper. The irradiated region may be a beam deflecting electrode which generates a beam deflecting electric field which deflects the beam, and for example, may be a beam deflecting electrode of the beam shaper 32, the beam scanner 34, the beam parallelizer 36, or the final energy filter 38.

The irradiated region may be a beam detection surface of a faraday cup for ion current detection used for adjusting the beam, and, for example, may be the beam detection surface of the second beam measuring instrument 80*b*, the third beam measuring instrument 80*c*, or another beam current measuring instrument. The irradiated region may be the wafer support portion 44 such as a plate which is attached on a surface of a wafer drive mechanism 42 and is disposed around the wafer 40. The irradiated region may be the wafer 40 or a dummy wafer.

The inventors of the present invention found that in the ultrahigh energy ion implantation, a nuclear reaction may occur between the ion of the nonradioactive nuclide which is incident into the ion beam irradiated target and the nonradioactive nuclide accumulated in the ion beam irradiated target as a result of the ion beam irradiation performed previously. The two nuclides that generates the nuclear reaction may be the same element. As the incident energy of the ion increases, a possibility of the nuclear reaction between different elements also increases. The nuclear reaction may occur between the ion of the nonradioactive nuclide which is incident into the ion beam irradiated target and other nonradioactive nuclides accumulated in the ion beam irradiated target. As a result of the nuclear reaction, a radioactive ray such as a neutron ray and a gamma ray may be generated. Even though the ion species used in the ion implantation is the nonradioactive nuclide, a problem of the radioactive ray may occur. In the related art, in typical ion implantation, a high energy in which the nuclear reaction is so active as to be a practical problem is not used. Therefore, in the ion implanter of the related art, a need to deal with the nuclear reaction is not recognized.

For example, in a case where the ion beam IB containing ions of $^{11}$B, which is the nonradioactive nuclide, is generated in the ion source 10, the following nuclear reaction may occur between $^{11}$B ion with which the irradiated region is irradiated and $^{11}$B accumulated in the irradiated region by previous irradiation. This nuclear reaction may be referred to as a B-B reaction below.

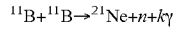

$$^{11}B + {}^{11}B \rightarrow {}^{21}Ne + n + k\gamma$$

Here, n indicates a neutron, γ indicates a gamma ray, and k is an integer. A nuclear reaction rate (that is, the number of nuclear reactions per unit time) of the nuclear reaction by which the radioactive ray is generated may increases and an intensity of the radioactive ray may become significant as the incident energy increases and/or as the ion beam current increases. Natural boron contains a small amount of $^{10}$B as a stable isotope. Also for $^{10}$B ion, the radioactive ray may be generated by the nuclear reaction similar to the B-B reaction. The radioactive ray may also be generated by nuclear reaction for other ion species such as carbon and nitrogen having relatively small atomic numbers between newly irradiated ions and ions or atoms previously accumulated in the irradiated region.

Figure 3:
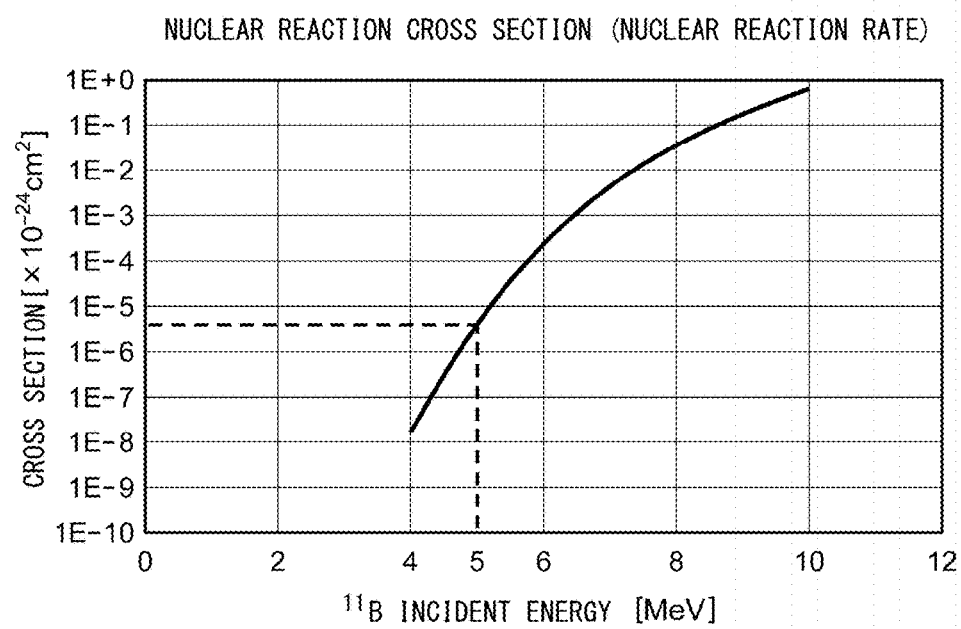
FIG. 3 is a graph showing a nuclear reaction cross section in a B-B reaction.

FIG. 3 is a graph showing a nuclear reaction cross section of the B-B reaction. A vertical axis of FIG. 3 indicates the nuclear reaction cross section between $^{11}$B $^{11}$B and a horizontal axis indicates the incident energy of $^{11}$B. The nuclear reaction cross section means a probability of occurrence of the nuclear reaction, and thus, the larger value represents that the nuclear reaction occurs more easily. FIG. 3 is a result of theoretical calculations. As shown in FIG. 3, in a case where the incident energy of $^{11}$B is an ultrahigh energy of 5 MeV or higher, the nuclear reaction cross section has a relatively large value, and thus, the B-B reaction tends to be the practical problem. Even in a case where the incident energy of $^{11}$B is the ultrahigh energy of 4 MeV to 5 MeV, the nuclear reaction cross section has a large value to some extent, and thus, the B-B reaction may be the practical problem. For example, if the beam current is large, the B-B reaction may occur significantly even in the case where the incident energy is 5 MeV or lower.

Figure 4:
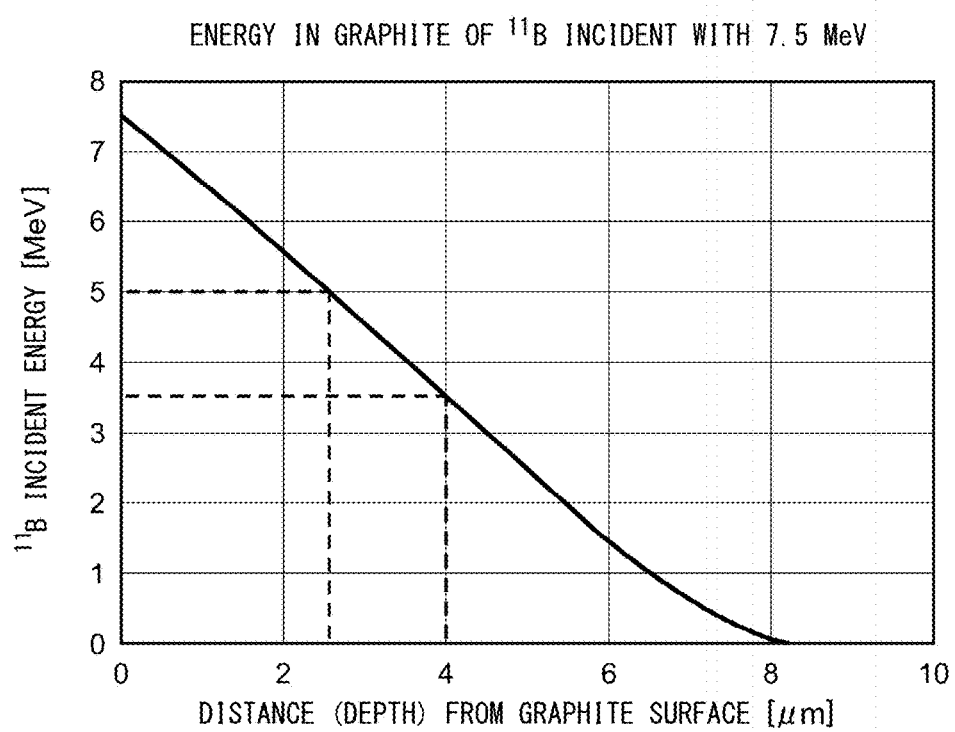
FIG. 4 is a graph showing an energy decay curve of boron.

FIG. 4 is a graph showing an energy decay curve of the $^{11}$B. The shown graph is the energy decay curve in a case where a material of the irradiated region is graphite and the $^{11}$B ion is incident into the surface of the irradiated region with the ultrahigh energy of 7.5 MeV. In general, the beam detection surface of the beam current measuring instrument such as the second beam measuring instrument 80*b* or the third beam measuring instrument 80*c* applied to the ion implanter 100 is formed of graphite. The irradiated regions of other ion beam irradiated targets such as the aperture plate, the beam shutter, or the beam damper are formed of graphite. In FIG. 4, the vertical axis indicates the energy of the $^{11}$B ion and the horizontal axis indicates the distance (depth) from the surface.

As shown, the energy of the $^{11}$B ion decreases as the depth increases. The energy of the $^{11}$B ion incident into the graphite decreases substantially linearly as the depth from the graphite surface increases. If as the incident energy of the $^{11}$B ion increases, the energy decay curve moves upward, and if the incident energy of the $^{11}$B ion decreases, the energy decay curve moves downwards. Regardless of change of the incident energy, the energy tends to decrease substantially linearly as the depth from the surface increases.

As in this example, in the case of the $^{11}$B ion having the incident energy of 7.5 MeV, the energy of 5 MeV or higher is maintained to the depth of 2.5 µm. Referring to FIG. 3, in a case where the energy of $^{11}$B ion is 5 MeV or higher, the nuclear reaction cross section is relatively large. Therefore, the boron existing in the region to the depth of 2.5 µm tends to cause the B-B reaction with the incident $^{11}$B ion. If a large amount of boron is accumulated in the region to the depth of 2.5 µm, the neutron ray may be generated from the irradiated region with a significant radiation dosage. Meanwhile, the energy of $^{11}$B ion is decreased to 3.5 MeV or lower in a region deeper than the depth of 4 µm. Therefore, even if the boron exists in the region deeper than the depth of 4 µm, the possibility that the B-B reaction occurs is sufficiently small, and thus, it can be ignored for practical use.

To secure safety in an operation of the ion implanter, it is desired that generation of the radioactive ray is sufficiently suppressed. If some radioactive rays are generated, it is desired to manage the radiation dosage of the radioactive ray. For example, it is expected that the radioactive ray is generated with a relatively high radiation dosage in an ion beam irradiation condition, such as a case where the incident energy is high and the ion beam current is high. In such a case, it is necessary to monitor and manage the ion beam irradiation condition and the radiation dosage of the radioactive ray.

From this viewpoint, the present inventors devised several countermeasures to deal with the nuclear reaction caused by the ultrahigh energy ion implantation which may occur in the beamline of the ion implanter 100. Hereinafter, these countermeasures will be explained by taking the B-B reaction as an example.

A first countermeasure includes estimation of the radiation dosage of the generated radioactive ray. The estimated radiation dosage of the radioactive ray can be used for a radiation dosage management of the radioactive ray. The ion implanter 100 may be configured to estimate the radiation dosage of neutron ray generated by the B-B reaction between the boron remaining in the irradiated region and newly irradiated boron. An appropriate warning may be displayed or output based on the estimated radiation dosage of the neutron ray. Since it is possible to urge the operator to take a necessary action by warning, safety in the operation of the ion implanter 100 can be enhanced. An interlock with respect to a neutron radiation dosage may be set. In a case where the neutron ray dosage is expected to exceed a set value, the ion implanter 100 may prohibit the following irradiation of the ion beam IB or may immediately stop the irradiation in the middle of the irradiation. In this way, an excessive occurrence of the neutron ray is suppressed, and safety in operation of the ion implanter 100 can be enhanced.

A second countermeasures involves switching of the irradiated regions. A plurality of irradiated regions may be provided so as to be switchable in one ion beam irradiated target. The ion implanter 100 may be configured to select an irradiated region bringing a relatively small estimated radiation dosage of the neutron ray from the plurality of switchable irradiated regions. If the ion beam IB is incident into the selected irradiated region, the excessive occurrence of the neutron ray is suppressed.

As a third countermeasure, the ion beam irradiated target includes a plurality of irradiated regions positioned at different locations, and the plurality of irradiated regions may include a high-energy-beam exclusive irradiated region allocated exclusively for a high energy ion beam accelerated to an energy exceeding a predetermined energy threshold value. The plurality of irradiated regions may include a low-energy-beam exclusive irradiated region allocated exclusively for a low energy ion beam accelerated to an energy of a predetermined energy threshold value or less. The ion implanter 100 may be configured to select an appropriate irradiated region from the plurality of irradiated regions according to the energy of the ion beam IB.

For the high energy ion beam IB, the boron ion can be implanted into the irradiated region at a deep position from the surface of the irradiated region. Almost no boron remains in a shallow position. As described with reference to FIG. 4, the energy of the incident boron ion is decreased according to the depth. While the ion has a high energy at a shallow position, the energy is lost as it moves to the deep position. As a result, at the deep position where the density of the remaining boron becomes high, the energy of the incident ion is lowered, and it is considered that the B-B reaction does hardly occur. Accordingly, by allocating the exclusive irradiated region to the high energy ion beam, an excessive generation of the neutron ray is suppressed. In the irradiated region exclusive to he low energy ion beam, the energy of the incident ion is low enough, and thus, the B-B reaction does not become a problem in the first place. Therefore, if the ion beam IB is incident into the selected irradiated region according to the energy, an excessive occurrence of the neutron ray is suppressed.

The countermeasures may be performed alone or in combination.

Figure 5:
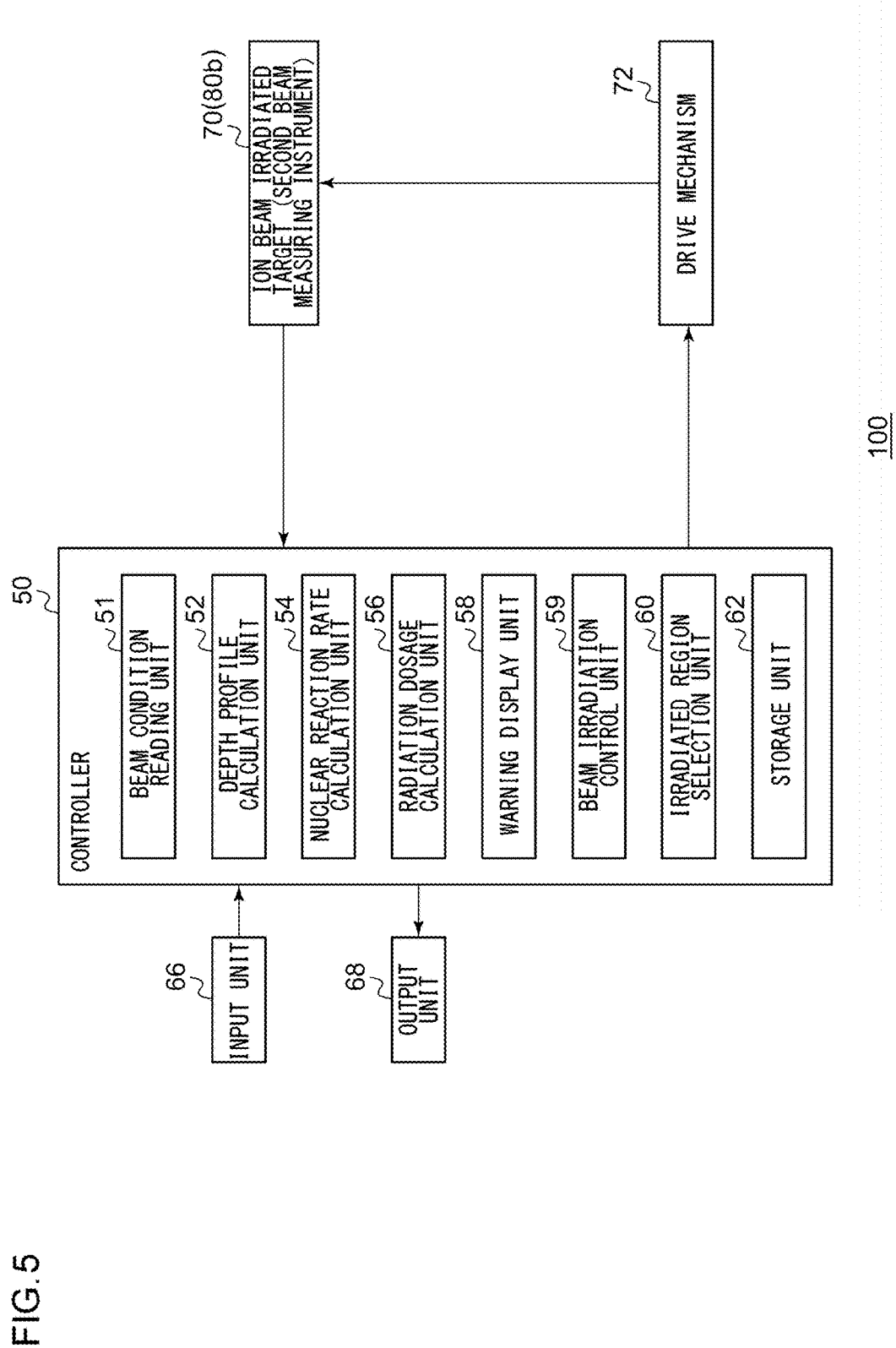
FIG. 5 is a block diagram showing a schematic configuration of a controller of the ion implanter according to the embodiment.

FIG. 5 is a block diagram showing a schematic configuration of a controller 50 of the ion implanter 100 according to the embodiment. A case in which the ion beam irradiated target 70 is the second beam measuring instrument 80b will be described as an example. The embodiment is also applicable in a case where the ion beam irradiated target 70 is the third beam measuring instrument 80c, another beam current measuring instrument, or another ion beam irradiated target.

Each block shown in a block diagram of the present specification can be realized by a mechanical device as a hardware configuration which includes chip or a circuit such as a CPU or a memory of a computer, and realized by a computer program or the like as a software configuration. Here, functional blocks realized by cooperation of them are shown. It is understood by a person skilled in the art that the functional blocks can be realized in various ways by a combination of hardware and software.

The controller 50 is configured to calculate the estimated radiation dosage of the neutron ray generated by the B-B reaction between the boron ion (for example, $^{11}$B ion or $^{10}$B ion) incident into the second beam measuring instrument 80b and the boron accumulated in the second beam measuring instrument 80b as a result of the ion beam irradiation performed previously.

The controller 50 includes a beam condition reading unit 51, a depth profile calculation unit 52, a nuclear reaction rate calculation unit 54, a radiation dosage calculation unit 56, a warning display unit 58, a beam irradiation control unit 59, an irradiated region selection unit 60, and a storage unit 62.

The controller 50 includes an input unit 66 and an output unit 68. The input unit 66 is configured to receive input from the operator or other apparatuses. For example, the input unit 66 includes input means such as a mouse or a keyboard for receiving an input from the operator and/or communication means for communicating with other apparatuses. The output unit 68 is configured to output data relating to the control of the ion implanter 100 and includes output means such as a display and a printer. The controller 50 can receive data input from the input unit 66 and/or can output data to the output unit 68.

A beam current measurement signal indicating an actually measured beam current which is measured by the second beam measuring instrument 80b is input to the controller 50. The controller 50 is configured to control a relative position adjustment mechanism configured to adjust a relative position between the ion beam irradiated target 70 and the ion beam IB such that the ion is incident into the selected irradiated region. For example, the relative position adjustment mechanism is a drive mechanism 72 configured to move the ion beam irradiated target 70 with respect to the ion beam IB.

The beam condition reading unit 51 reads the ion beam irradiation condition. For example, the ion beam irradiation condition includes a material of the irradiated region, an area of the irradiated region, the energy of the ion beam IB, an irradiation amount per unit time, an irradiation time, an implantation angle or the like. The ion beam irradiation condition is input from the input unit 66 by the operator or read from the storage unit 62.

The depth profile calculation unit 52 calculates an estimated depth profile of the boron accumulated in the second beam measuring instrument 80b. The depth profile indicates a concentration distribution in the depth direction formed in the irradiated region. For example, the depth profile calculation unit 52 may calculate the estimated depth profile of the boron by integrating the depth profiles of the boron calculated for a plurality of ion beam irradiation conditions.

In this way, it is possible to calculate the estimated depth profile of the boron at an optional time. The depth profile calculation unit 52 stores the estimated depth profile of the boron calculated, in the storage unit 62.

Figure 6:
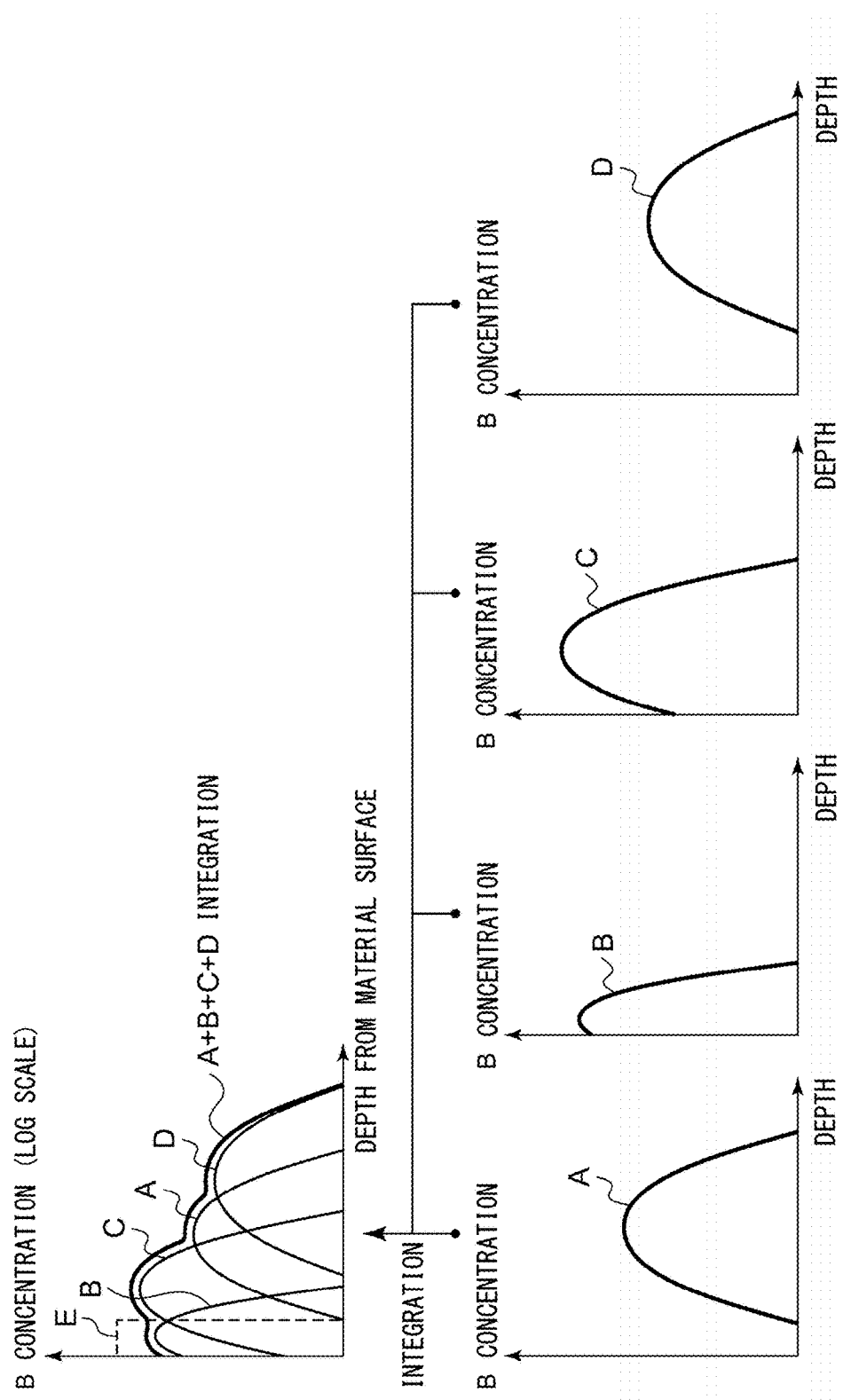
FIG. 6 is a graph for explaining an exemplary calculation of an estimated depth profile.

FIG. 6 is a graph for explaining an exemplary calculation of the estimated depth profile. The boron is accumulated in the irradiated region each time an irradiated region of ion beam irradiated target 70 is irradiated by the beam according to the ion beam irradiation condition. The depth profile of the accumulated boron depends on the ion beam irradiation condition. As shown in FIG. 6, four different ion beam irradiation conditions form different depth profiles A to D in the irradiated region, respectively. The depth profile formed in the irradiated region as a result of repeated ion beam irradiations under various ion beam irradiation conditions is given by the accumulation of each depth profile formed under each ion beam irradiation condition. The depth profile formed in the irradiated region as a result of irradiations with the four different ion beam irradiation conditions shown in FIG. 6 can be obtained by integrating the depth profiles A to D.

Alternatively, in order to decrease a calculation load, the depth profile calculation unit 52 may calculate the estimated depth profile of the boron in a simplified manner. For example, it may be assumed that the depth profile has a constant concentration value up to a certain depth. In other words, the depth profile may be represented by a single concentration value such as an average value or a maximum value.

As described above, in a depth region closer (or shallower) to the surface of the irradiated region, the energy of the incident ion is higher and the B-B reaction is easier to occur, and thus, the depth profile of the shallow region is important. Accordingly, as indicated by a dashed line E in FIG. 6, it may be assumed that the total amount of the boron contained in an actual depth profile exists in only a depth region which is shallow in comparison with the actual depth profile. This assumes that boron of a higher concentration exists in a surface layer portion of the irradiated region than actually, and thus, the estimated radiation dosage of the neutron ray is calculated to be larger than actually. Therefore, it is considered that the radiation dosage of the neutron ray which is actually generated is less than the estimated radiation dosage. This corresponds to taking a higher safety factor for estimation, which is safer for the operation of the ion implanter.

The nuclear reaction rate calculation unit 54 calculates an estimated nuclear reaction rate, based on the ion beam irradiation condition and the estimated depth profile of the boron. The nuclear reaction rate indicates the number of occurrences of the nuclear reaction per unit time. The nuclear reaction rate calculation unit 54 can calculate the estimated nuclear reaction rate, based on the energy of the ion beam IB, the irradiation amount of the ion per unit time, and the estimated depth profile calculated by the depth profile calculation unit 52. The nuclear reaction rate calculation unit 54 may calculate the estimated nuclear reaction rate by a known calculation method for calculating the nuclear reaction rate of the B-B reaction. The nuclear reaction rate calculation unit 54 stores the estimated nuclear reaction rate calculated, in the storage unit 62.

The energy of the ion beam IB used for the calculation may be given as the energy decay curve determined according to the incident energy into the surface of the irradiated region and the material of the irradiated region. Alternatively, in order to decrease the calculation load, it may be assumed that the energy of the ion beam IB is a constant value (for example, a value equal to the incident energy into the surface of the irradiated region) in the depth direction. It is assumed that the energy in the deep region is higher than actually, and thus, the estimated radiation dosage of the neutron ray is calculated to be larger than actually. Accordingly, it is considered that the radiation dosage of the neutron ray which is actually generated is less than the estimated radiation dosage. This corresponds to taking a higher safety factor for estimation, which is safer for the operation of the ion implanter.

The irradiation amount per unit time used for the calculation may be an estimated value calculated from the ion beam irradiation condition. Alternatively, in order to improve the accuracy of estimation, the irradiation amount per unit time may be obtained from the actually measured beam current which is measured by the second beam measuring instrument 80*b* which is the ion beam irradiated target 70.

The radiation dosage calculation unit 56 calculates the estimated radiation dosage of the neutron ray, based on the estimated nuclear reaction rate calculated by the nuclear reaction rate calculation unit 54. The radiation dosage calculation unit 56 may calculate the estimated radiation dosage of the neutron ray by the known calculation method to calculate the radiation dosage of the neutron ray generated by the B-B reaction. The radiation dosage calculation unit 56 may calculate the estimated radiation dosage of the radioactive ray at a desired position outside of the beamline or the ion implanter 100, based on the estimated radiation dosage of the neutron ray, position information of the ion beam irradiated target 70 in the beamline, and disposition information of a radioactive ray shielding material provided in the periphery of the beamline. In this way, it is possible to monitor the estimated radiation dosage of the radioactive ray at an optional time. The radiation dosage calculation unit 56 stores the estimated radiation dosage of the neutron ray, in the storage unit 62. The estimated radiation dosage of the neutron ray may be output to the output unit 68.

The warning display unit 58 may determine whether or not the estimated radiation dosage of the neutron ray calculated by the radiation dosage calculation unit 56 exceeds a predetermined upper limit of the radiation dosage. The warning display unit 58 displays a warning in a case where the estimated radiation dosage of the neutron ray exceeds the predetermined upper limit of the radiation dosage. The warning may be output to the output unit 68. The warning may be a warning prompting an exchange of the ion beam irradiated target 70. The warning display unit 58 does not display a warning in a case where the estimated radiation dosage of the neutron ray does not exceed the predetermined upper limit of the radiation dosage. For example, the predetermined upper limit of the radiation dosage can be appropriately set based on empirical or experimental findings.

The beam irradiation control unit 59 may determine whether or not the estimated radiation dosage of the neutron ray calculated by the radiation dosage calculation unit 56 exceeds the predetermined upper limit of the radiation dosage. The beam irradiation control unit 59 may prohibit the ion beam irradiated target 70 from being irradiated with the ion beam IB in a case where the estimated radiation dosage of the neutron ray exceeds the predetermined upper limit of the radiation dosage. If the ion beam irradiated target 70 is not currently irradiated with the ion beam IB, the beam irradiation control unit 59 may not allow the subsequent ion beam irradiation. In the middle of the ion beam irradiation, the beam irradiation control unit 59 may stop the ion beam irradiation. The beam irradiation control unit 59 may permit or continue the ion beam irradiation in a case where the estimated radiation dosage of the neutron ray does not exceed the predetermined upper limit of the radiation dosage. The upper limit of the radiation dosage for determining the prohibition of the irradiation may be the same as or different from the upper limit of the radiation dosage for warning.

For the ion beam irradiated target 70 having only a single irradiated region, in the case where the estimated radiation dosage of the neutron ray exceeds the predetermined upper limit of the radiation dosage, the beam irradiated target 70 may be exchanged with a new ion beam irradiated target 70 at an appropriate occasion such as the next maintenance work.

The ion beam irradiated target 70 may include a plurality of irradiated regions positioned at different locations. The irradiated region selection unit 60 may select an optional irradiated region from the plurality of irradiated regions of the ion beam irradiated target 70 such that the estimated radiation dosage of the neutron ray calculated by the radiation dosage calculation unit 56 is lower than the predetermined upper limit of the radiation dosage. The irradiated region selection unit 60 may control the drive mechanism 72 to move the ion beam irradiated target 70 with respect to the ion beam IB such that the ion is incident on the selected irradiated region.

The irradiated region selection unit 60 may newly select different irradiated regions each time the ion beam irradiation condition is changed. The irradiated region selection unit 60 may newly select different irradiated regions in a case where the estimated radiation dosage of the neutron ray for the selected irradiated region exceeds the predetermined upper limit of the radiation dosage.

The ion implanter 100 may include an ion beam deflection mechanism configured to deflect the ion beam IB such that the selected irradiated region is irradiated with the ion beam IB, as an example of the relative position adjustment mechanism.

FIGS. 7A to 7C are schematic views showing a switching structures having the plurality of irradiated regions 74 provided in the ion beam irradiated target 70. FIG. 7A shows the second beam measuring instrument 80*b* and FIGS. 7B and 7C show the aperture plate 82.

As shown in FIG. 7A, the second beam measuring instrument 80*b* includes four irradiated regions 74 arranged in two rows and two columns on one side of a plate-shaped member. Each irradiated region 74 is a faraday cup. The drive mechanism 72 can move the second beam measuring instrument 80*b* in two horizontal and vertical directions on a plane in which the irradiated regions 74 are disposed, and can move the second beam measuring instrument 80*b* such that the ion beam IB (not shown) is incident into an optional irradiated region 74. The ion beam IB is incident into the second beam measuring instrument 80*b* in a direction perpendicular to the paper surface.

It is not essential for the irradiated region 74 and the faraday cup to correspond one to one. The plurality of irradiated regions 74 may be provided in one faraday cup. That is, an area of the beam detection surface of the faraday cup may be used as one irradiated region 74 and another area which does not overlap the area may be used as another irradiated region 74. Alternatively, the plurality of faraday cups may be provided in one irradiated region 74.

As shown in FIG. 7B, the aperture plate 82 has two slits 83 extending in parallel to each other, and one irradiated region 74 is arranged for each slit 83. The irradiated region 74 and the slit 83 may correspond one to one or may not correspond one to one. As shown in FIG. 7C, the plurality of irradiated regions 74 may be disposed so as not to overlap each other along one slit 83. For example, an upper portion in the vicinity of the slit 83 may be used as one irradiated region 74, and a lower portion in the vicinity of the slit 83 may be used as another irradiated region 74 so as not to overlap the irradiated region 74 of the upper portion.

Various methods are possible for the disposition of the plurality of irradiated regions 74 and the movement of the ion beam irradiated target 70. Several examples are shown in FIG. 8A to 8D.

Figure 8A:
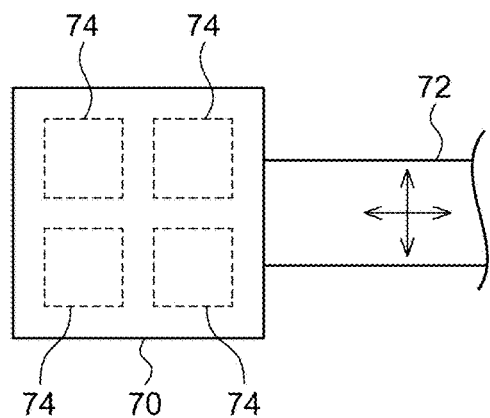
FIGS. 8A to 8D are schematic views showing the switching structure of the plurality of irradiated regions provided in the ion beam irradiated target.
Figure 8B:
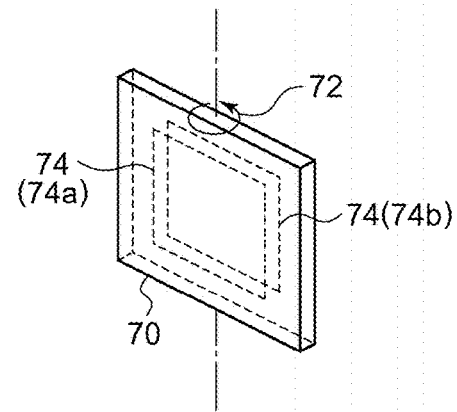

As shown in FIG. 8A, the ion beam irradiated target 70 may have a planar shape, the plurality of irradiated regions 74 may be arranged on the plane, and the drive mechanism 72 may move the ion beam irradiated target 70 in a direction parallel to the plane such that the irradiated regions 74 are switched. The plurality of irradiated regions 74 may be arranged in a line and the drive mechanism 72 may move the ion beam irradiated target 70 along the arrangement direction of the irradiated regions 74. As shown in FIG. 8B, the plurality of irradiated regions 74 may be disposed on a front and back surfaces of a plate, the drive mechanism 72 may invert the ion beam irradiated target 70 such that the irradiated regions 74 are switched.

Figure 8C:
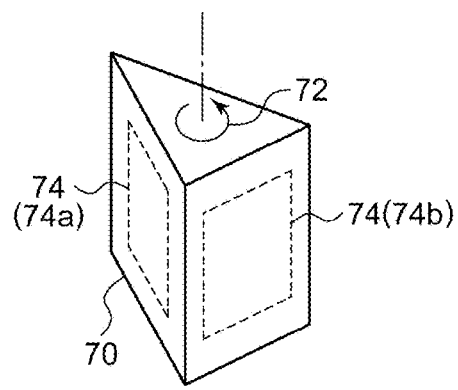

As shown in FIG. 8C, the ion beam irradiated target 70 may have a prismatic shape (for example, a triangular prism shape or a quadrangular prism shape), the plurality of irradiated regions 74 may be disposed on the side surfaces of the prism, the drive mechanism 72 may rotate the ion beam irradiated target 70 around a central axis of the prism or an axis parallel to the central axis of the prism such that the irradiated regions 74 are switched. The irradiated regions 74 may be disposed one by one on each side surface of the prism, or the plurality of irradiated regions 74 may be disposed on each side surface of the prism. In a case where the plurality of irradiated regions 74 are disposed on one side surface, the drive mechanism 72 may move the ion beam irradiated target 70 in a direction parallel to the side surface such that the irradiated regions 74 are switched.

Figure 8D:
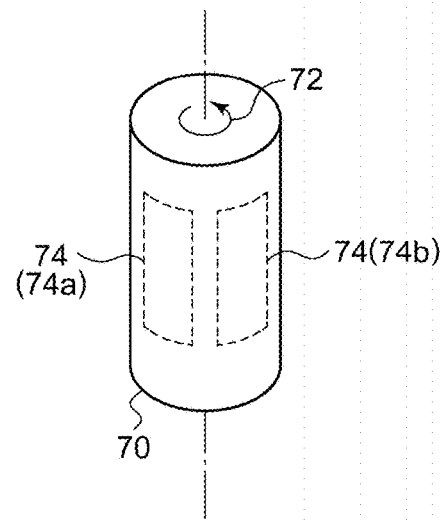

As shown in FIG. 8D, the ion beam irradiated target 70 may have a cylindrical shape, the plurality of irradiated regions 74 may be disposed at different angular positions on the side surface of the cylinder, and the drive mechanism 72 may rotate the ion beam irradiated target 70 around a central axis of the cylinder or an axis parallel to the central axis of the cylinder such that the irradiated regions 74 are switched. The irradiated regions 74 may be disposed one by one at different angular positions of the cylinder or the plurality of irradiated regions 74 may be disposed at the same angular position of the cylinder. The drive mechanism 72 may move the ion beam irradiated target 70 in the direction of the central axis such that the irradiated regions 74 are switched.

Figure 9:
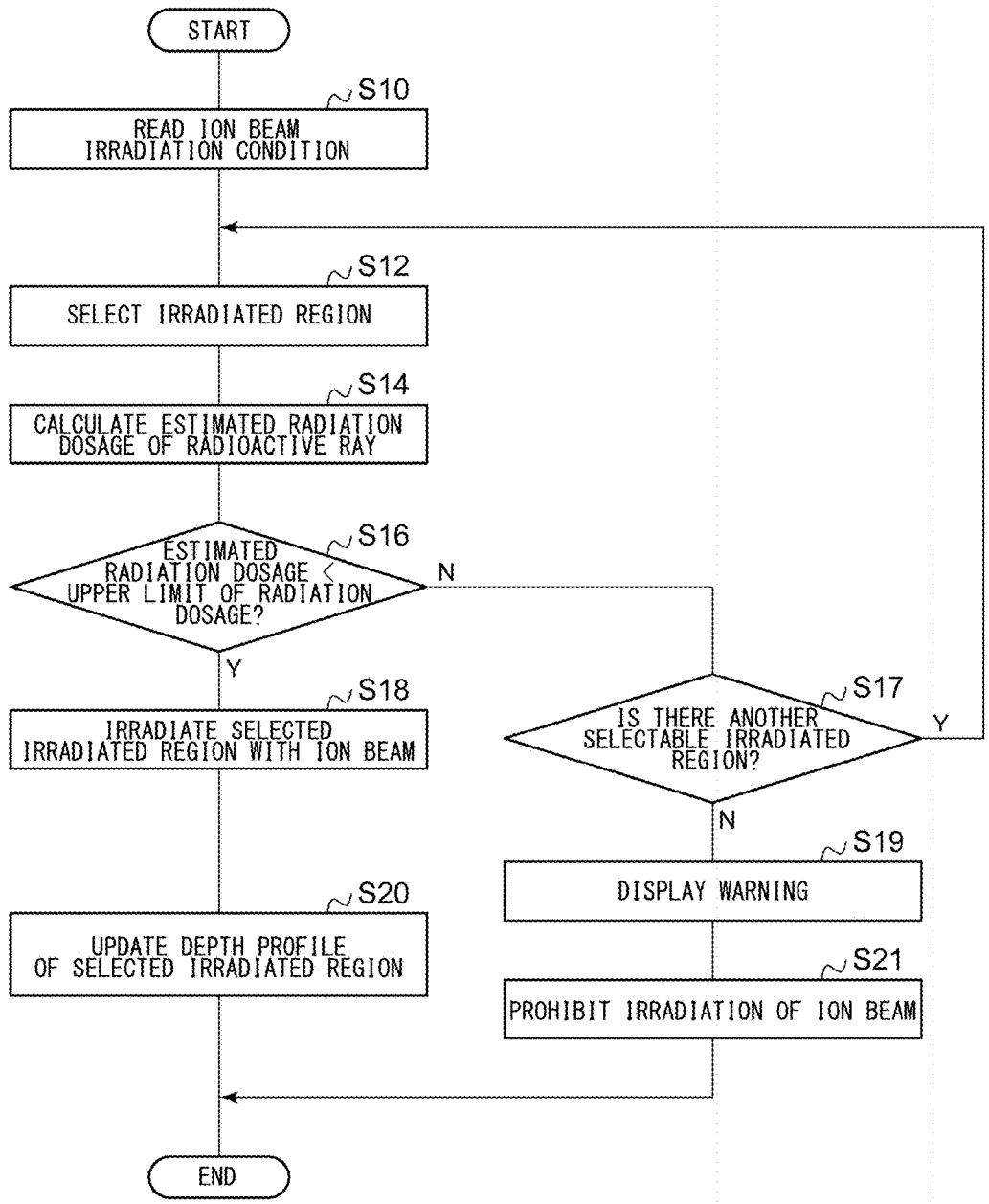
FIG. 9 is a flowchart showing a switching process of the irradiated regions of the ion beam irradiated target according to the embodiment.

FIG. 9 is a flowchart showing a switching process of the irradiated region 74 of the ion beam irradiated target 70 according to the embodiment. This process is performed by the controller 50. If the process starts, first, the ion beam irradiation condition is read into the beam condition reading unit 51 of the controller 50 (S10). For example, the read ion beam irradiation condition is an ion beam irradiation condition used for the next irradiation. Alternatively, for example, for a provisional calculation of the radiation dosage of the radioactive ray, an optional ion beam irradiation condition may be read into the controller 50.

The irradiated region 74 is selected (S12). The irradiated region selection unit 60 may select the irradiated region 74 selected in the previous process as it is. Alternatively, the irradiated region selection unit 60 may newly select another irradiated region 74.

The estimated radiation dosage of the radioactive ray is calculated (S14). As described with reference to FIG. 5, the controller 50 calculates the estimated radiation dosage of the radioactive ray generated from the selected irradiated region 74, based on the depth profile already formed in the selected irradiated region 74 and the read ion beam irradiation condition.

The irradiated region selection unit 60 determines whether or not the estimated radiation dosage of the radioactive ray exceeds the predetermined upper limit of the radiation dosage (S16). In a case where the estimated radiation dosage of the radioactive ray exceeds the predetermined upper limit of the radiation dosage (N in S16), it is determined whether or not there is another selectable irradiated region 74 (S17). In a case where there is the another selectable irradiated region 74 (Y in S17), the irradiated region selection unit 60 selects the another irradiated region 74 (S12). Here, the irradiated region selection unit 60 selects the irradiated region 74 for which the estimated radiation dosage of the radioactive ray has been determined not to exceed the predetermined upper limit of the radiation dosage. The irradiated region 74 for which the estimated radiation dosage of the radioactive ray has been determined to exceed the predetermined upper limit of the radiation dosage in past process is not selected. For the selected irradiated region 74, the estimated radiation dosage of the radioactive ray is calculated (S14) and it is determined again whether or not the estimated radiation dosage of the calculated radioactive ray exceeds the predetermined upper limit of the radiation dosage (S16).

In a case where there is not the another selectable irradiated region 74 (N in S17), the controller 50 displays a warning (S19) and prohibits the ion beam irradiation to the ion beam irradiated target 70 (S21).

In a case where the estimated radiation dosage of the radioactive ray does not exceed the predetermined upper limit of the radiation dosage (Y in S16), the selected irradiated region 74 is irradiated with the ion beam IB (S18). The relative position between the ion beam irradiated target 70 and the ion beam IB is adjusted such that the ion is incident into the selected irradiated region 74, and the ion beam irradiated target 70 is supported by the beamline at the position. The ion beam IB is generated by the ion source 10 and is accelerated by the high energy multistage linear acceleration unit 14. The ion beam IB is transported by the beamline in the downstream side of the high energy multistage linear acceleration unit 14, and the ion beam irradiated target 70 is irradiated with the ion beam.

After the ion beam irradiated target 70 is irradiated with the ion beam IB, the depth profile of the selected irradiated region 74 is updated (S20). The depth profile calculation unit 52 integrates a depth profile newly accumulated by the irradiation of the present ion beam IB with the existing depth profile. The updated depth profile is saved in the storage unit 62, and the present process ends.

Figure 10A:
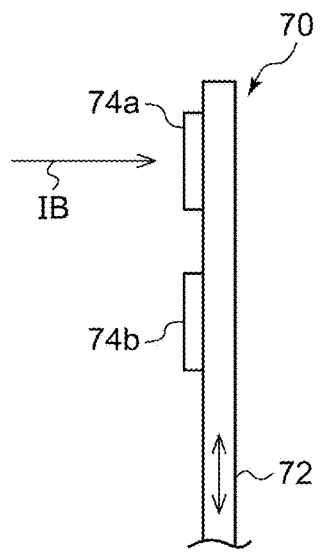
FIGS. 10A to 10C are schematic views showing other examples of the ion beam irradiated targets.
Figure 10B:
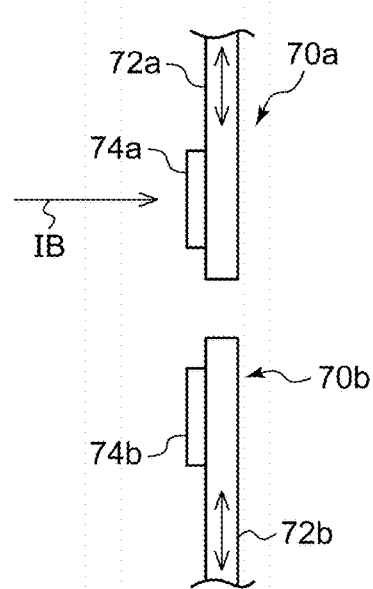
Figure 10C:
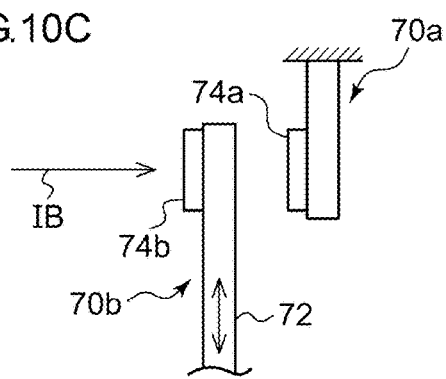

FIGS. 10A to 10C are schematic views showing other examples of the ion beam irradiated targets 70. As shown in FIG. 10A, the ion beam irradiated target 70 includes a first irradiated region 74a and a second irradiated region 74b which are disposed in a driving direction by the drive mechanism 72. Accordingly, the ion beam irradiated target 70 can select the irradiated region irradiated with the ion beam IB from the first irradiated region 74a and the second irradiated region 74b, by driving the drive mechanism 72.

The ion beam irradiated target 70 may be the second beam measuring instrument 80b or other beam current measuring instruments. The first irradiated region 74a and the second irradiated region 74b may be faraday cups, respectively. The ion beam irradiated target 70 may be other ion beam irradiated targets.

The first irradiated region 74a is allocated exclusively for a high energy ion beam accelerated to the energy exceeding a predetermined energy threshold value. The second irradiated region 74b is allocated exclusively for a low energy ion beam accelerated to the energy of the predetermined energy threshold value or less. For example, the predetermined energy threshold value is in the ultrahigh energy range of 4 MeV or higher, or 5 MeV or higher. For example, the predetermined energy threshold value can be appropriately set based on empirical or experimental findings.

In the example shown in FIG. 10A, the ion beam irradiated target 70 includes one first irradiated region 74a and one second irradiated region 74b. However, the ion beam irradiated target 70 may include a plurality of first irradiated regions 74a and a plurality of second irradiated regions 74b. The ion beams having different energies may be allocated to the plurality of first irradiated regions 74a (or the plurality of second irradiated regions 74b), respectively. Alternatively, similarly to FIGS. 7A to 7C, the plurality of first irradiated regions 74a (or the plurality of second irradiated region 74b) may be switchable independently of the energy.

As shown in FIG. 8B, the ion beam irradiated target 70 may have a planar shape, the first irradiated region 74a may be disposed on the front surface of the ion beam irradiated target 70, and the second irradiated region 74b may be disposed on the rear surface of the ion beam irradiated target 70. The drive mechanism 72 may invert the ion beam irradiated target 70 such that the first irradiated region 74a and the second irradiated region 74b are switched.

As shown in FIG. 8C, the ion beam irradiated target 70 has a prismatic shape, the first irradiated region 74a may be disposed on one side surface of the prism, and the second irradiated region 74b may be disposed on another side surface of the prism. The drive mechanism 72 may rotate the ion beam irradiated target 70 around the central axis of the prism or an axis parallel to the central axis of the prism such that the first irradiated region 74a and the second irradiated region 74b are switched. As shown in FIG. 8D, the ion beam irradiated target 70 has a cylindrical shape, the first irradiated region 74a may be disposed at an angular position on the side surface of the cylinder, and the second irradiated region 74b may be disposed at another angular position on the side surface of the cylinder. The drive mechanism 72 may rotate the ion beam irradiated target 70 around the central axis of the cylinder or an axis parallel to the central axis such that the first irradiated region 74a and the second irradiated region 74b are switched.

As shown in FIG. 10B, a first ion beam irradiated target 70a having the first irradiated region 74a and a second ion beam irradiated target 70b having the second irradiated region 74b may be provided. The first ion beam irradiated target 70a and the second ion beam irradiated target 70b may be movable such that the first irradiated region 74a and the second irradiated region 74b are switched. The first ion beam irradiated target 70a may be driven by a first drive mechanism 72a and the second ion beam irradiated target 70b may be driven by a second drive mechanism 72b.

As shown in FIG. 10C, one of the first ion beam irradiated target 70a and the second ion beam irradiated target 70b may be fixed, and the other thereof may be made movable by the drive mechanism 72. The first ion beam irradiated target 70a (or the second ion beam irradiated target 70b) may be fixed and the second ion beam irradiated target 70b (or the first ion beam irradiated target 70a) may be movable forward and backward with respect to a path of the ion beam IB in front of the first irradiated region 74a (or the second irradiated region 74b).

A plurality of irradiated regions 74 of the ion beam irradiated target 70 may be allocated according to the ion species. For example, the ion beam irradiated target 70 may include an irradiated region for the boron ion and another irradiated region for other ion species. As the irradiated regions for the boron ion, the first irradiated region 74a and the second irradiated region 74b described above may be provided. Alternatively, the first irradiated region 74a may be allocated to a high energy ion beam of the boron ion and the second irradiated region 74b may be allocated to a low energy ion beam of the boron ion and ion beams of other ion species.

Figure 11:
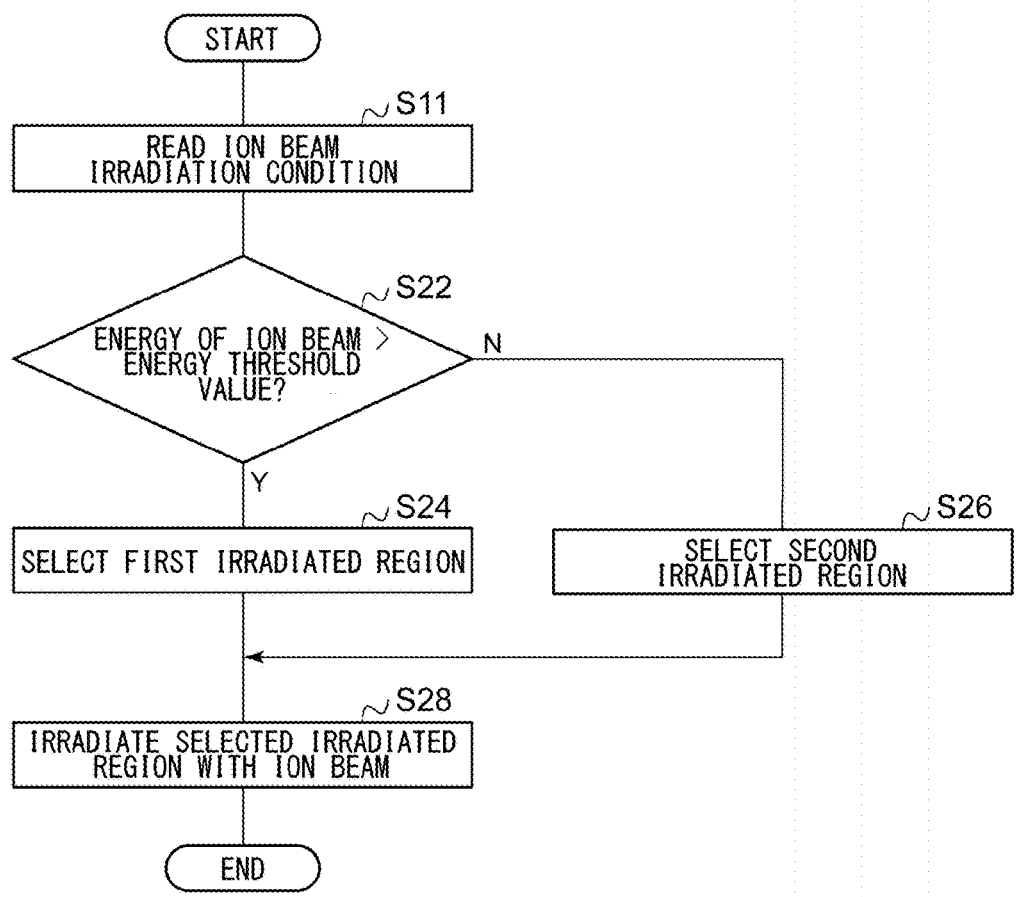
FIG. 11 is a flowchart showing another switching process of the irradiated regions of the ion beam irradiated target according to the embodiment.

FIG. 11 is a flowchart showing an other switching process of the irradiated region 74 of the ion beam irradiated target 70 according to the embodiment. This process is performed by the controller 50. If the process starts, first, the ion beam irradiation condition is read into the beam condition reading unit 51 of the controller 50 (S11).

Next, determination of the ion beam irradiation condition is performed. The irradiated region selection unit 60 determines whether or not the energy of the ion beam incident into the ion beam irradiated target 70 exceeds a predetermined energy threshold value (S22). In a case where the energy of the ion beam incident into the ion beam irradiated target 70 exceeds the predetermined energy threshold value (Y in S22), the irradiated region selection unit 60 selects the first irradiated region 74a (S24). In a case where the energy of the ion beam incident into the ion beam irradiated target 70 does not exceed the predetermined energy threshold value (N in S22), the irradiated region selection unit 60 selects the second irradiated region 74b (S26). Thereafter, the selected irradiated region 74 is irradiated with the ion beam IB (S28). In this way, the present process ends.

The irradiated region selection unit 60 may determine whether or not the ion beam incident into the ion beam irradiated target 70 is an ion beam containing the boron ion. The irradiated region selection unit 60 may select the first irradiated region 74a in a case where the boron ion beam exceeds the predetermined energy threshold value. The irradiated region selection unit 60 may select the second irradiated region 74b in a case where the boron ion beam does not exceed the predetermined energy threshold value. The irradiated region selection unit 60 may select the second irradiated region 74b in the case where the ion beam does not contain the boron ion.

By switching the irradiated regions according to the energy and the ion species of the ion beam, the estimated radiation dosage of the generated radioactive ray decreases or is substantially eliminated. Therefore, the controller 50 may not calculate the estimated radiation dosage of the radioactive ray for the first irradiated region 74a and the second irradiated region 74b. Alternatively, to ensure that the radiation dosage of the generated radioactive rays is sufficiently low, the controller 50 may calculate the estimated radiation dosage of radioactive ray for only the first irradiated region 74a.

It should be understood that the invention is not limited to the above-described embodiment, but may be modified into various forms on the basis of the spirit of the invention. Additionally, the modifications are included in the scope of the invention.

Embodiments of the present invention can be described as follows.

1. An ion implanter, including: an ion source configured to generate an ion beam including an ion of a nonradioactive nuclide; a beamline configured to support an ion beam irradiated target; and a controller configured to calculate an estimated radiation dosage of a radioactive ray generated by a nuclear reaction between the ion of the nonradioactive nuclide incident into the ion beam irradiated target and the nonradioactive nuclide accumulated in the ion beam irradiated target as a result of ion beam irradiation performed previously.

2. The ion implanter according to 1, wherein the nonradioactive nuclide is $^{11}B$ or $^{10}B$ and the generated radioactive ray is a neutron ray.

3. The ion implanter according to 1 or 2, further including: an accelerator which can accelerate the ion beam generated by the ion source to an ultrahigh energy higher than or equal to at least 4 MeV.

4. The ion implanter according to any one of 1 to 3, wherein the controller includes a depth profile calculator which calculates an estimated depth profile of the nonradioactive nuclides accumulated in the ion beam irradiated target, a nuclear reaction rate calculator which calculates an estimated nuclear reaction rate based on an ion beam irradiation condition including an energy of the ion beam and an irradiation amount of the ion beam per unit time and based on the estimated depth profile of the nonradioactive nuclide, and a radiation dosage calculator which calculates the estimated radiation dosage of the generated radioactive ray based on the estimated nuclear reaction rate.

5. The ion implanter according to 4, wherein the depth profile calculator calculates the estimated depth profile of the nonradioactive nuclides accumulated in the ion beam irradiated target by integrating each depth profile of the nonradioactive nuclide which is calculated for each ion beam irradiation condition.

6. The ion implanter according to any one of 1 to 5, wherein the controller is configured to display a warning and/or to prohibit irradiation of the ion beam to the ion beam irradiated target in a case where the estimated radiation dosage of the generated radioactive ray exceeds a predetermined upper limit of the radiation dosage.

7. The ion implanter according to any one of 1 to 6, wherein the ion beam irradiated target includes a plurality of irradiated regions which are positioned at locations different from each other, wherein the controller is configured to select any one of the plurality of irradiated regions such that the estimated radiation dosage of the generated radioactive ray becomes less than a predetermined upper limit of the radiation dosage, and wherein the beamline includes a relative position adjustment mechanism configured to adjust a relative position between the ion beam irradiated target and the ion beam such that the ion of the nonradioactive nuclide is incident into the selected irradiated region.

8. The ion implanter according to any one of 1 to 7, wherein the ion beam irradiated target includes a high-energy-beam exclusive irradiated region which is allocated exclusively for a high energy ion beam accelerated to an energy exceeding a predetermined energy threshold value.

9. The ion implanter according to 8, wherein the controller calculates the estimated radiation dosage of the generated radioactive ray for the high-energy-beam exclusive irradiated region.

10. The ion implanter according to 8 or 9, wherein the predetermined energy threshold value is in an ultrahigh energy range higher than or equal to at least 4 MeV.

11. The ion implanter according to any one of 1 to 10, wherein the ion beam irradiated target is configured as a beam current measuring instrument provided in the beamline, and wherein the controller calculates the estimated radiation dosage of the generated radioactive ray based on an actually measured beam current which is measured by the beam current measuring instrument.

12. The ion implanter according to any one of 1 to 10, wherein the ion beam irradiated target is configured to be at least a part of either one of the following: a beam deflection unit, an aperture plate, a beam shutter, a beam damper, a wafer support portion, or a wafer.

13. An ion beam irradiated target which is provided in a beamline of an ion implanter, including: a plurality of irradiated regions which are positioned at locations different from each other, wherein the plurality of irradiated regions include a high-energy-beam exclusive irradiated region which is allocated exclusively for a high energy ion beam accelerated to an energy exceeding a predetermined energy threshold value.

14. An ion implantation method, including: generating an ion beam including an ion of a nonradioactive nuclide; supporting an ion beam irradiated target; and calculating an estimated radiation dosage of a radioactive ray generated by a nuclear reaction between the ion of the nonradioactive nuclide incident into the ion beam irradiated target and the nonradioactive nuclide accumulated in the ion beam irradiated target as a result of ion beam irradiation performed previously.

What is claimed is:

1. An ion implanter, comprising:
    an ion source configured to generate an ion beam including an ion of a nonradioactive nuclide;
    a beamline configured to support an ion beam irradiated target; and
    a controller configured to calculate an estimated radiation dosage of a radioactive ray generated by a nuclear reaction between the ion of the nonradioactive nuclide incident into the ion beam irradiated target and the nonradioactive nuclide accumulated in the ion beam irradiated target as a result of ion beam irradiation performed previously.

2. The ion implanter according to claim 1, wherein the nonradioactive nuclide is $^{11}$B or $^{10}$B and the generated radioactive ray is a neutron ray.

3. The ion implanter according to claim 1, further comprising:
    an accelerator which can accelerate the ion beam generated by the ion source to an ultrahigh energy higher than or equal to at least 4 MeV.

4. The ion implanter according to claim 1,
wherein the controller includes
    a depth profile calculator which calculates an estimated depth profile of the nonradioactive nuclides accumulated in the ion beam irradiated target,
    a nuclear reaction rate calculator which calculates an estimated nuclear reaction rate based on an ion beam irradiation condition including an energy of the ion beam and an irradiation amount of the ion beam per unit time and based on the estimated depth profile of the nonradioactive nuclide, and
    a radiation dosage calculator which calculates the estimated radiation dosage of the generated radioactive ray based on the estimated nuclear reaction rate.

5. The ion implanter according to claim 4,
wherein the depth profile calculator calculates the estimated depth profile of the nonradioactive nuclides accumulated in the ion beam irradiated target by integrating each depth profile of the nonradioactive nuclide which is calculated for each ion beam irradiation condition.

6. The ion implanter according to claim 1,
wherein the controller is configured to display a warning and/or to prohibit irradiation of the ion beam to the ion beam irradiated target in a case where the estimated radiation dosage of the generated radioactive ray exceeds a predetermined upper limit of the radiation dosage.

7. The ion implanter according to claim 1,
wherein the ion beam irradiated target includes a plurality of irradiated regions which are positioned at locations different from each other,
wherein the controller is configured to select any one of the plurality of irradiated regions such that the estimated radiation dosage of the generated radioactive ray becomes less than a predetermined upper limit of the radiation dosage, and
wherein the beamline includes a relative position adjustment mechanism configured to adjust a relative position between the ion beam irradiated target and the ion beam such that the ion of the nonradioactive nuclide is incident into the selected irradiated region.

8. The ion implanter according to claim 1,
wherein the ion beam irradiated target includes a high-energy-beam exclusive irradiated region which is allocated exclusively for a high energy ion beam accelerated to an energy exceeding a predetermined energy threshold value.

9. The ion implanter according to claim 8,
wherein the controller calculates the estimated radiation dosage of the generated radioactive ray for the high-energy-beam exclusive irradiated region.

10. The ion implanter according to claim 8,
wherein the predetermined energy threshold value is in an ultrahigh energy range higher than or equal to at least 4 MeV.

11. The ion implanter according to claim 1,
wherein the ion beam irradiated target is configured as a beam current measuring instrument provided in the beamline, and
wherein the controller calculates the estimated radiation dosage of the generated radioactive ray based on an actually measured beam current which is measured by the beam current measuring instrument.

12. The ion implanter according to claim 1,
wherein the ion beam irradiated target is configured to be at least a part of either one of the following: a beam deflection unit, an aperture plate, a beam shutter, a beam damper, a wafer support portion, or a wafer.

13. An ion beam irradiated target which is provided in a beamline of an ion implanter, comprising:
    a plurality of irradiated regions which are positioned at locations different from each other,
    wherein the plurality of irradiated regions include a high-energy-beam exclusive irradiated region which is allocated exclusively for a high energy ion beam accelerated to an energy exceeding a predetermined energy threshold value.

14. An ion implantation method, comprising:
generating an ion beam including an ion of a nonradioactive nuclide;
supporting an ion beam irradiated target; and
calculating an estimated radiation dosage of a radioactive ray generated by a nuclear reaction between the ion of the nonradioactive nuclide incident into the ion beam irradiated target and the nonradioactive nuclide accumulated in the ion beam irradiated target as a result of ion beam irradiation performed previously.

* * * * *